(12) United States Patent
Chung et al.

(10) Patent No.: US 6,510,094 B2
(45) Date of Patent: Jan. 21, 2003

(54) METHOD AND APPARATUS FOR REFRESHING SEMICONDUCTOR MEMORY

(75) Inventors: Min-Chul Chung, Seoul (KR); Chang-Rae Kim, Songnam (KR); Sang-Jib Han, Suwon (KR); Jong-Yul Park, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/940,909

(22) Filed: Aug. 28, 2001

(65) Prior Publication Data

US 2002/0054530 A1 May 9, 2002

(30) Foreign Application Priority Data

Nov. 9, 2000 (KR) ........................................ 2000-66347

(51) Int. Cl.[7] ................................................. G11C 7/00
(52) U.S. Cl. .............. 365/222; 365/230.03; 365/230.06
(58) Field of Search ............................ 365/222, 230.03, 365/226, 189.09, 203, 230.06

(56) References Cited

U.S. PATENT DOCUMENTS

| | | | | | |
|---|---|---|---|---|---|
| 4,984,208 A | * | 1/1991 | Sawada et al. | ............. | 365/222 |
| 5,406,526 A | * | 4/1995 | Sugibayashi et al. | .. | 365/230.03 |
| 5,822,257 A | * | 10/1998 | Ogawa | ........................ | 365/200 |
| 6,031,779 A | * | 2/2000 | Takahashi et al. | .......... | 365/226 |
| 6,078,542 A | * | 6/2000 | Tomishima | ............. | 365/230.03 |
| 6,172,918 B1 | * | 1/2001 | Hidaka | ................... | 365/189.11 |
| 6,226,208 B1 | * | 5/2001 | Nakai et al. | ................. | 365/191 |
| 6,333,884 B1 | * | 12/2001 | Kato et al. | ................... | 365/208 |

* cited by examiner

*Primary Examiner*—David Nelms
*Assistant Examiner*—Gene N. Auduong
(74) *Attorney, Agent, or Firm*—F. Chau & Associates, LLP

(57) ABSTRACT

Disclosed is a semiconductor memory device, comprising a plurality of sub-word line drivers arranged at all memory cell array blocks in the direction of bit lines and respectively shared by two memory cell array blocks, a plurality of block sense amplifiers arranged at all memory cell array blocks in the direction of word lines and respectively shared by two memory cell array blocks, a plurality of circuit blocks respectively arranged at conjunction areas where areas accommodating sub-word line drivers and block sense amplifiers are crossed; said conjunction areas comprising one or more LA drivers adapted to drive block sense amplifiers, one or more PXiD circuits adapted to generate driving control signals to control sub-word line drivers, and one or more BSYD circuits adapted to selectively enables LA drivers in response to transmitted block control signals; and a plurality of block control units adapted to generate upper and lower block control signals by combining column and row block address decoding signals and simultaneously activating two or more BSYD circuits with the block control signals.

20 Claims, 6 Drawing Sheets

METHOD AND APPARATUS FOR REFRESHING SEMICONDUCTOR MEMORY

BACKGROUND OF THE INVENTION

1. Field of the Invention

The invention relates to a method of, and apparatus for, refreshing semiconductor memory.

2. Discussion of the Related Art

Two of the most common types of RAM cells are static random access memory (SRAM) and dynamic random access memory (DRAM). SRAM cells have a static latching structure that can indefinitely store data so long as power is applied. DRAM cells have storage nodes comprising capacitors and transistors. DRAM cells store data by holding a charge in the capacitors.

Because electric charge leaks out of all capacitors, it is regarded as a characteristic of DRAM that data cannot be stored permanently. The charged storing nodes discharge, therefore DRAM cells need periodic "refreshing" with a new electric charge. The aforementioned periodic refreshing operations are generally performed to each cell a number of times per second to prevent loss of data.

A refresh circuit is used to perform the DRAM refreshing operations. Early DRAMs performed the refresh operations under the control of an external memory device. Recently, most DRAM devices have an internal logic circuit combined with the refresh circuit to perform "internal refreshing operations." Conventionally, internally refreshing DRAM devices have different external operation conditions from those for SRAMs. Specifically, internally refreshing DRAMs should satisfy at least one of two external operation conditions, (1) a definite write restoration time to be added to the last part of every write cycle and (2) a maximum write cycle time, neither of which are needed for SRAM. An elapsing write restoration time makes the DRAM write access time slower than regular read access time, and a maximum write cycle time imposes a maximum limit to the length of an external write cycle, both conditions imposed to prevent loss of data before refresh.

Despite the refresh requirements, there are a number of advantages that DRAMs have over SRAMs. Among them, DRAM cells are smaller than SRAM cells produced by similar fabricating processes. Reduction of memory cell size reduces production costs while providing larger data storage capacity. Thus, it is preferable to develop DRAMs that can replace SRAMs without imposing additional external operational conditions.

U.S. Pat. No. 4,984,208, issued on Jun. 12, 1989, entitled "Dynamic Read/Write Memory Device Having Better Refresh Operations" discloses a DRAM circuit that can satisfy conditions of write restoration time and maximum cycle time.

An array layout structure of DRAM cells of a conventional DRAM device accessing in a partial word line activation method was disclosed by Takahashi and others in U.S. Pat. No. 6,031,779, issued Feb. 29, 2000, wherein sub-arrays of the memory cells are surrounded with block sense amplifier arrays and sub-word line driver arrays.

FIG. 1 shows a general layout of a refresh-type semiconductor memory device layout as commonly used in the art and as may be used in this invention, if desired. A plurality of memory cell array blocks 40 are divided into n number of row blocks and m number of column blocks, and a plurality of memory sense amplifiers 30 are arranged between the cell array blocks 40 in the direction of rows or bit lines. The block sense amplifiers 30 are shared by two memory cell array blocks 40, but not for those arranged at both ends of the memory cell array blocks 40. In the direction of word lines or columns, sub-word line drivers SWD 20 are arranged between the memory cell array blocks 40 in the structure such that two memory cell array blocks 40 share one sub-word line driver 20. Even though not shown in FIG. 1, row and column decoders are arranged in the row and column directions. The row and column decoders designate addresses for specific memory cells.

In the layout structure shown in FIG. 1, those block sense amplifiers 30 and sub-word line drivers 20 disposed at the periphery of the layout are not shared, but rather connected only with one memory cell array block 40. In FIG. 1, there are portions of the array where areas accommodating the block sense amplifiers 30 and sub-word line drivers 20 are crossed. The crossed areas are called conjunction areas 50. Drivers (not shown) are disposed in the conjunction areas 50 to drive the block sense amplifiers 30.

In the layout structure, after a bit line BL is precharged, a normal word line enable signal NWE and an address coding LSB signal PXi are transmitted to selectively activate one of word lines arranged in the column direction of the array. Then, the selected word line turns on access transistors of the memory cells connected thereto, so as to allow a storing node of each memory cell and a specific bit line connected to the memory cell to share the charge. As a result, the block sense amplifiers 30 sense the activated bit line and then store the sensed data with internal latches. The stored data is passed to an input/output line when a column select line CSL is enabled in response to a column address decoding signal. In this case, if data is not passed to the input/output line because the column select line CSL is not enabled, the data is re-written to a corresponding memory cell during an active restoration process, and a refresh operation is performed while the word line is activated.

In a general architecture of a DRAM device, all memory cells connected to word lines to be enabled can share the electric charge regardless of active restoration or refresh operation. The drivers of the conjunction area 50 (hereinafter, "LA drivers") should be driven in advance to facilitate data sensing by the block sense amplifiers 30 connected to bit lines of the selected memory cell array blocks. This process requires comparatively large amounts of power. Conventional methods to reduce such power consumption include partial word line activation wherein only a minimum number of word lines and LA drivers are enabled and driven. In other words, column block information signals decoded by column addresses are mixed to enable only word lines corresponding to a memory cell array block 40 whose column select line CSL opens and to drive only a LA driver corresponding to the memory cell array block 40.

However, there have been problems in application of the partial word line activation method to the DRAM architecture. For example, two memory cell array blocks may share a new charge when a word line is enabled. This is because a SWD array 20 is shared by two memory cell array blocks 40 for purposes of minimizing the size of the DRAM device.

Besides, the other problem is that it is difficult to drive only a LA driver to drive a block sense amplifier commonly connected to two block bit lines because the partial word line activation method accesses in the structure where sub-word line driver 20 and block sense amplifier 30 are shared by memory cell array blocks. In other words, if an output signal ORed by a column block address decoded signal, for instance, a block selection Y (BSY) signal, controls circuits of conjunction areas, only word lines related to the two cell array blocks are activated to drive only a corresponding LA driver that receives an OR output signal, but not other LA drivers of the conjunction areas positioned over and under the driven driver. At this time, there is no problem in the sensing or active restoration process, but at the price of a significant reduction in the total driving capacity of the block sense amplifiers 30. Consider the situation wherein all block sense amplifiers of a row block whose LA driver is selected are enabled and driven, then other LA drivers of conjunction areas positioned over and under the selected one are not driven when using the partial word line activation method. As a result, the reduction in the driving capacity as such may result in a decrease in the speed of sensing and active restoration of bit lines.

Even if the problems of decreasing the speed of sensing and active restoration processes can be solved by enlarging the size of PMOS and NMOS transistors of LA drivers, there may be another problem of increasing an area accommodating the layout structure of a device.

Therefore, an improved technique is desirable to secure the driving capacity of LA drivers without enlarging the size of driving transistors of LA drivers in a semiconductor memory device accessing in a partial word line activation method. In other words, it is desirable to develop a device that can reduce consumption of active power, secure the driving capacity of LA drivers and improve the speed of sensing and active restoration (re-writing of cell data) processes of memory cells, thereby making a progress in the performance of the semiconductor memory device.

SUMMARY OF THE INVENTION

Disclosed herein is a semiconductor memory device, comprising a plurality of sub-word line drivers arranged at all memory cell array blocks in the direction of bit lines and respectively shared by two memory cell array blocks; a plurality of block sense amplifiers arranged at all memory cell array blocks in the direction of word lines and respectively shared by two memory cell array blocks; a plurality of circuit blocks respectively arranged at conjunction areas where areas accommodating sub-word line drivers and block sense amplifiers are crossed, said conjunction areas comprising: one or more LA drivers adapted to drive block sense amplifiers; one or more PXiD circuits adapted to generate driving control signals to control sub-word line drivers; and one or more BSYD circuits adapted to selectively enables LA drivers in response to transmitted block control signals; and a plurality of block control units adapted to generate upper and lower block control signals by combining column and row block address decoding signals and simultaneously activating two or more BSYD circuits with the block control signals.

In another aspect of the invention, the block control unit generates upper and lower block control signals BSYou, BSYod and block control signals in combination with column block address decoding signals SY1–Sym, row address decoding LSB signals X0,X0#, and output signals BSYid, BSYiu of the block control unit.

In another aspect of the invention, the row address decoding LSB signal X0 is activated at the same time when odd word line driving signal PX1 or PX3 is activated, and the row address decoding LSB signal X0# is activated at the same time that even word line driving signals PX0 or PX2 is activated.

In another aspect of the invention, the level of the block control signal generated by the block control unit is a high level of voltage, VVP, higher than that of the normal supply voltage.

In another aspect of the invention, the LA drivers of a plurality of circuit blocks are arranged in each conjunction area.

In another aspect of the invention, the LA drivers in a plurality of circuit blocks are respectively arranged by two conjunction area.

In another aspect of the invention, all the block control signals BSYi respectively output from a plurality of block control units are set at the high level thereof during the refresh operations of the memory cells.

Disclosed is an embodiment of a semiconductor memory device, comprising a plurality of memory cell array blocks constructed with a plurality of refresh type memory cells; a refresh circuit adapted to generate refresh address signals to refresh the memory cells during a refresh operation; row and column decoders adapted to designate addresses to one or more memory cells according to address signals; a plurality of sub-word line drivers arranged at the memory cell array blocks in the first direction and shared by two memory cell array blocks; a plurality of block sense amplifiers arranged at the memory cell array blocks in the second direction, in perpendicular to that of the first one, and shared by two memory cell array blocks; a plurality of circuit blocks constructed with LA drivers respectively arranged at each conjunction area, where areas accommodating sub-word line drivers and block sense amplifiers are crossed, adapted to drive the block sense amplifiers, a PXiD circuit that generates driving control signals to control sub-word line drivers to activate sub-word lines connected with the memory cells; and a BSYD circuit adapted to selectively enable said LA drivers in response to transmitted block control signals; and a plurality of block control units arranged correspondingly to the number of circuit blocks and adapted to respectively generate upper and lower block control signals by combining column and row block address decoding signals and simultaneously activating two or more BSYD circuits of the circuit blocks.

In another aspect of this embodiment, the block control units further comprises a first NAND gate adapted to generate a NAND response by receiving one of row address decoding LSB signals X0,X0# and column block address decoding signals SYi; a second NAND gate adapted to generate a NAND response by receiving the rest of the row address decoding LSB signals X0,X0# and column block address decoding signals SYi; a NOR gate adapted to generate a NOR response by receiving the column block address decoding signals and output signals BSYid, BSYiu of the block control unit respectively positioned at top and bottom parts thereof; a first inverter adapted to invert an output of the first NAND gate and generate an upper block control signal BSYou; a second inverter adapted to invert an output of the second NAND gate and generate a lower block control signal BSYou; and a third inverter adapted to invert an output of the NOR gate and generate a block control signal BSYi.

In another aspect of the embodiment, the BSYD circuit comprises a first inverter adapted to invert the block control signals; a second inverter adapted to invert an output of the first inverter; a NAND gate adapted to receive an output of the second inverter and the first drive enable signal and outputting a result of NAND gating them as a first driver activation control signal; and a NOR gate 104 adapted to receive an output of the first inverter and the second activation enable signal and outputting a result of NOR gating them as a second drive activation control signal.

In another aspect of the embodiment the PXiD circuit comprises a first NAND gate adapted to receive address coding LSB signals PXi and the block control signals to generate a NAND response; a second NAND gate adapted to receive address coding LSB signals PXi and the block control signals to generate a NAND response; a first inverter operated by a high level of voltage adapted to invert an output of the first NAND gate and generating the first driving control signal to control the sub-word line drivers; and a second inverter adapted to invert an output of the second NAND gate and generating the second driving control signal PXiDD to control the sub-word line driver.

In another aspect of the embodiment, the LA drivers comprise a PMOS transistor with its source being connected with a node where cell array supply voltage is supplied, its gate to receive the first driver activation control signal and its drain to output a first block sense amplifier activation signal; a NMOS transistor with its source being connected to a node where supply voltage is provided, its gate to receive the second driver activation control signal and its drain to output the second block sense amplifier activation signal; the first and second NMOS transistors with its drain-source channel being connected between drains of the PMOS and NMOS transistors and all gates to commonly receive an equalize signal; and an equalizing NMOS transistor with its gate to receive the equalizing signal and its drain-source channel being connected between the drains of the PMOS and NMOS transistor.

In another aspect of the embodiment, the BSYD circuit comprises a first inverter adapted to invert the block control signals; a second inverter adapted to invert an output of the first inverter; a NAND gate adapted to receive an output of the second inverter and the first drive enable signal and outputting a result of NAND gating them as a first driver activation control signal; and a NOR gate 104 adapted to receive an output of the first inverter and the second activation enable signal and outputting a result of NOR gating them as a second drive activation control signal.

Also disclosed is a method of operating a semiconductor memory device, comprising combining column block address decoding signals and row address decoding LSB signals; and activating with a combined signals respectively two BSYD circuits that drive LA drivers arranged in conjunction areas.

In another aspect of the method, 4 LA drivers are driven to drive two block sense amplifiers when two BSYD circuits are activated.

In another aspect of the method, sensing and active restoration processes are performed to non-selected column memory cell array blocks that commonly share word lines of selected column memory cell array blocks as well as the column memory cell array blocks selected when two BSYD circuits are activated.

Disclosed is a semiconductor memory device, comprising a plurality of sub-word line drivers arranged at all memory cell array blocks in the direction of bit lines and respectively shared by two memory cell array blocks; a plurality of block sense amplifiers arranged at all memory cell array blocks in the direction of word lines and respectively shared by two memory cell array blocks; a plurality of circuit blocks respectively arranged at conjunction areas where areas accommodating sub-word line drivers and block sense amplifiers are crossed, said conjunction areas comprising: one or more LA driver means for driving said block sense amplifiers; one or more PXiD circuit means for generating driving control signals to control sub-word line drivers; and one or more BSYD circuit means for selectively enabling LA drivers in response to transmitted block control signals; and a plurality of block control unit means for generating upper and lower block control signals.

DETAILED DESCRIPTION OF THE INVENTION

Figure 1:
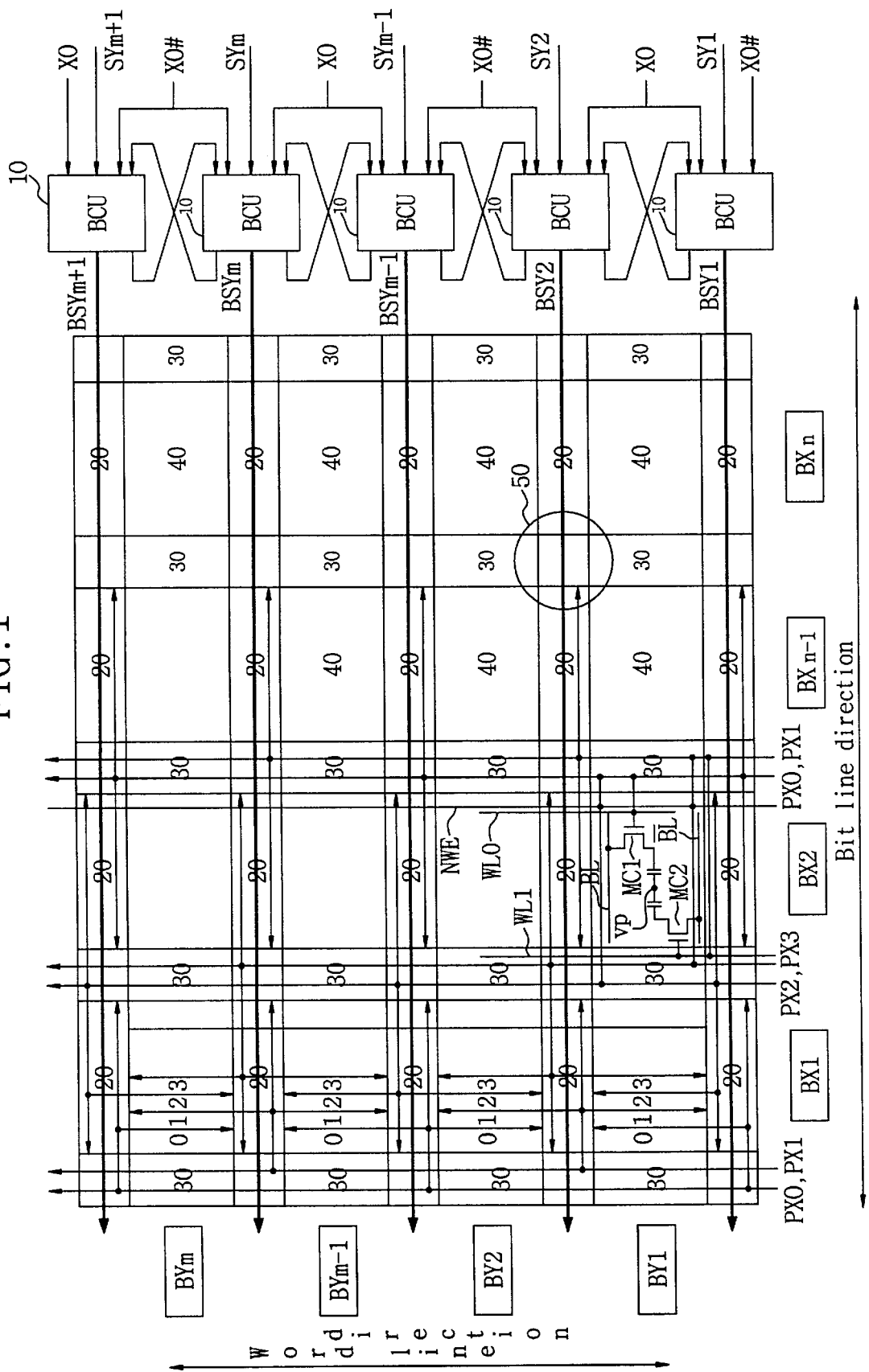
FIG. 1 is a layout view of a refresh type semiconductor memory device of the present invention, accessing in a partial word line activation method.

FIG. 1 is a typical layout structure of a refresh-type semiconductor memory device accessing in a partial word line activation method as may be used with the present invention. A plurality of memory cell array blocks 40, block sense amplifiers 30 and sub-word line drivers 20 are arranged in the same manner as those in the conventional DRAM architecture, thereby minimizing data penalty in the layout structure. In other words, except at both ends of memory cell array blocks 40 in the direction of word lines or bit lines, one sub-word line driver 20 and one block sense amplifier 30 are shared by two memory cell array blocks 40.

Figure 2:
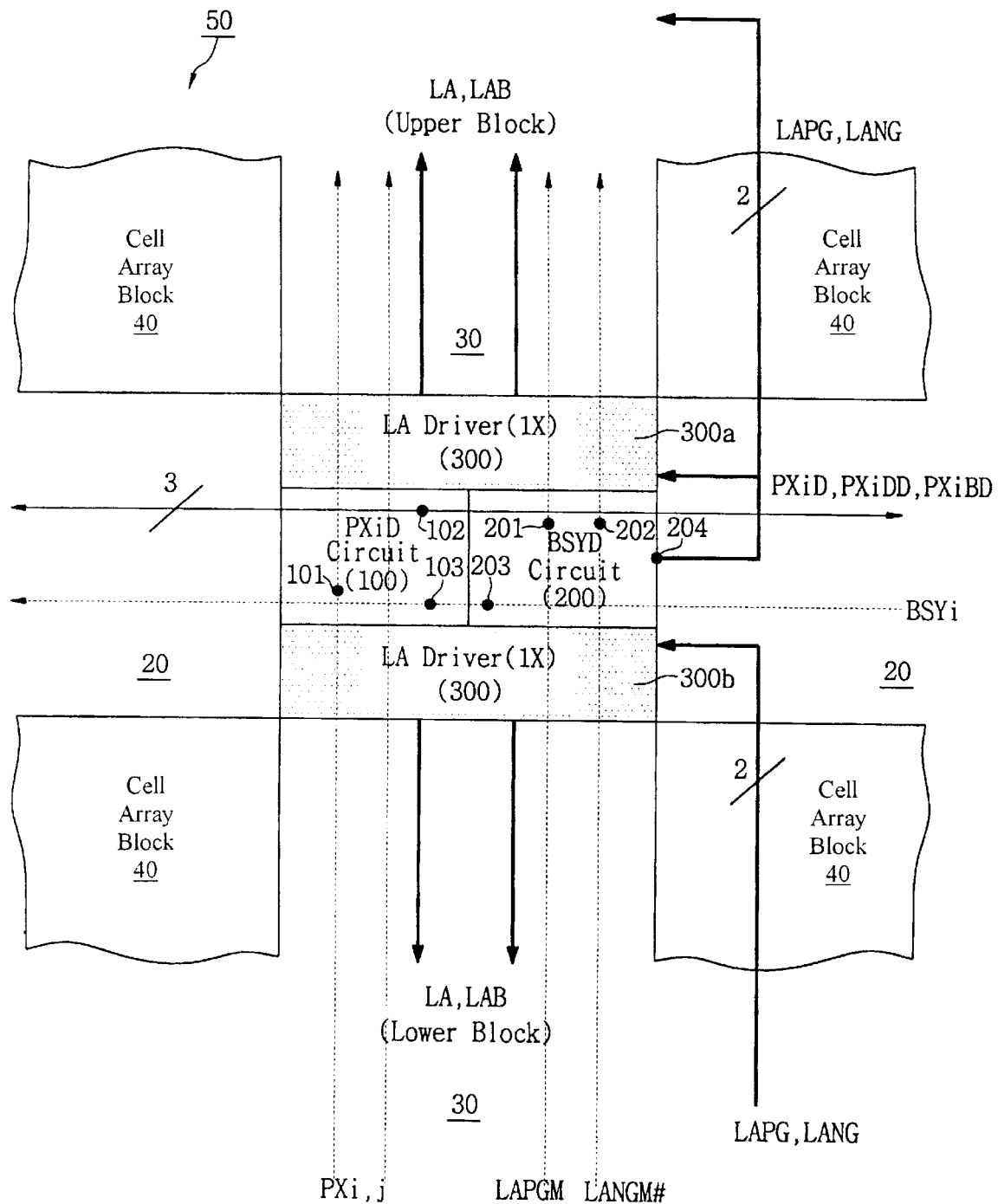
FIG. 2 illustrates a layout structure of conjunction areas shown in FIG. 1 in accordance with an embodiment of the present invention.
Figure 3:
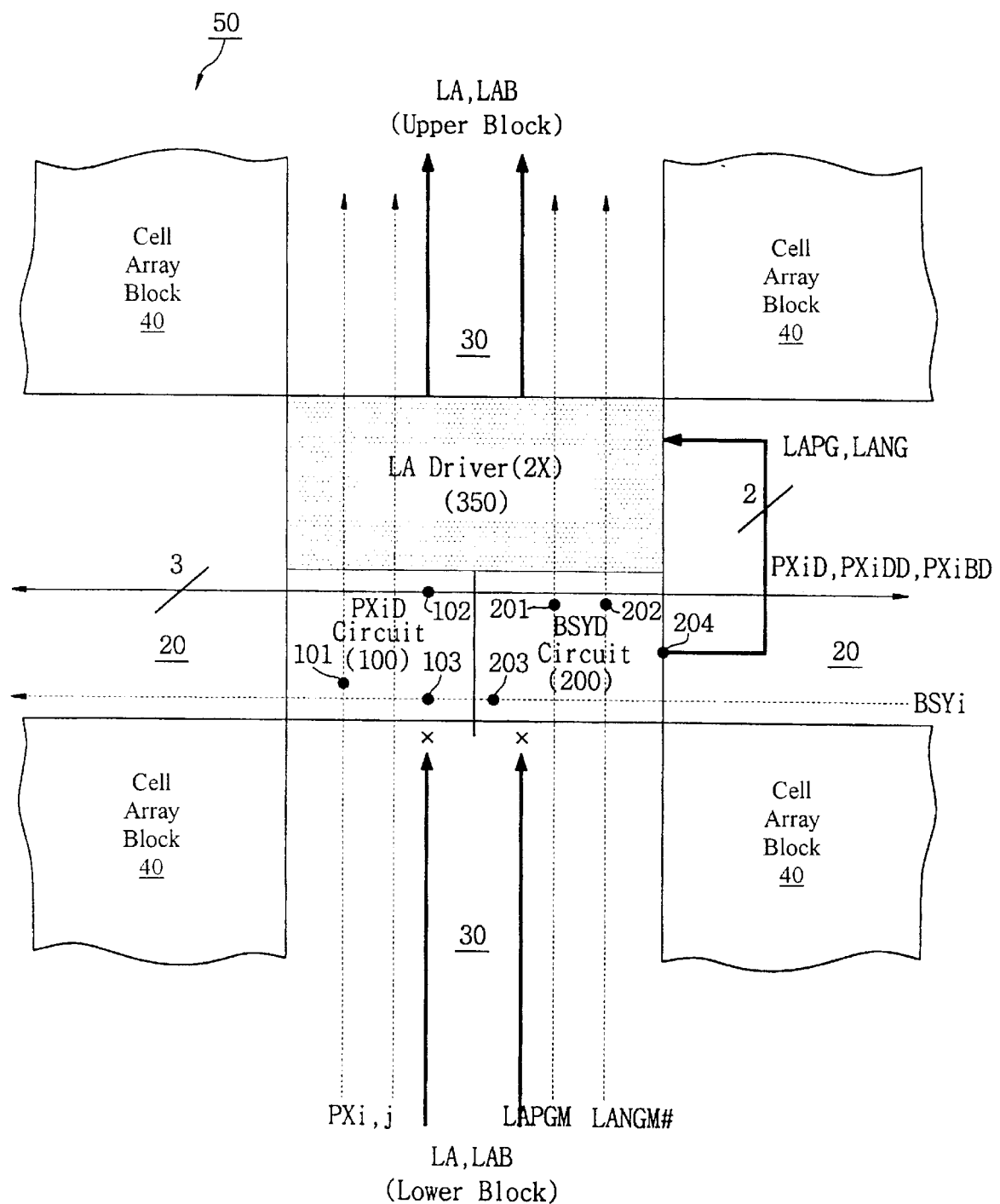
FIG. 3 illustrates a layout structure of conjunction areas shown in FIG. 1 in accordance with another embodiment of the present invention.

Referring to FIGS. 2 and 3, in conjunction areas 50 where block sense amplifiers 30 and sub-word line drivers 20 are crossed, there is arranged a circuit block comprising LA drivers 300, PXiD circuits 100, and BSYD circuits 200. At this time, the LA drivers 300 drive the block sense amplifiers 30. The PXiD circuits 100 generate driving control signals to control the sub-word line drivers. The block selection Y driver (BSYD) circuits 200 selectively enable the LA drivers in response to transmitted block control signals.

FIGS. 2 and 3 illustrate the layout structures of the conjunction areas 50 of FIG. 1 in accordance with different embodiments of present invention. A specific description will be made in relation to those layout structures. Normal word line enable NWE signal lines are arranged over the memory cell array blocks 40 in the direction of word lines, being in connection with corresponding sub-word line drivers 20 to enable word lines. When address coding LSB signals, PX0, PX1, PX2, PX3 are activated the word lines W10, W11, WL2, WL3 connected with word line drivers 20. At this time, word lines are commonly connected with two memory cell array blocks 40 except the highest and lowest parts of the array. In addition, the address coding LSB signals PXi (PX0, PX1,PX2, PX3) connected with PXiD circuit 100 run the top portion of the block sense amplifier 30 to the column direction (of word lines). At this time, PX0 and PX1 turn into a pair, and PX3 and PX4 another pair. The output signals of the PXiD circuit 100, PXiD, PXiDD, PXiBD are arranged in the row direction (of bit lines) and shared by two sub-word line drivers 20.

In order to improve the speed of sensing and active restoration processes of memory cells by securing the driving capacity of LA drivers, the column block address decoding signal and row address decoding LSB signals (X0,X0# from FIG. 1) are combined to drive two BSYD circuits 200 of the conjunction area 50 at the same time. The processes are performed by the block control unit (BCU) 10 shown in FIG. 1. A detailed embodiment of the block control unit 10 is shown in FIG. 5.

Figure 5:
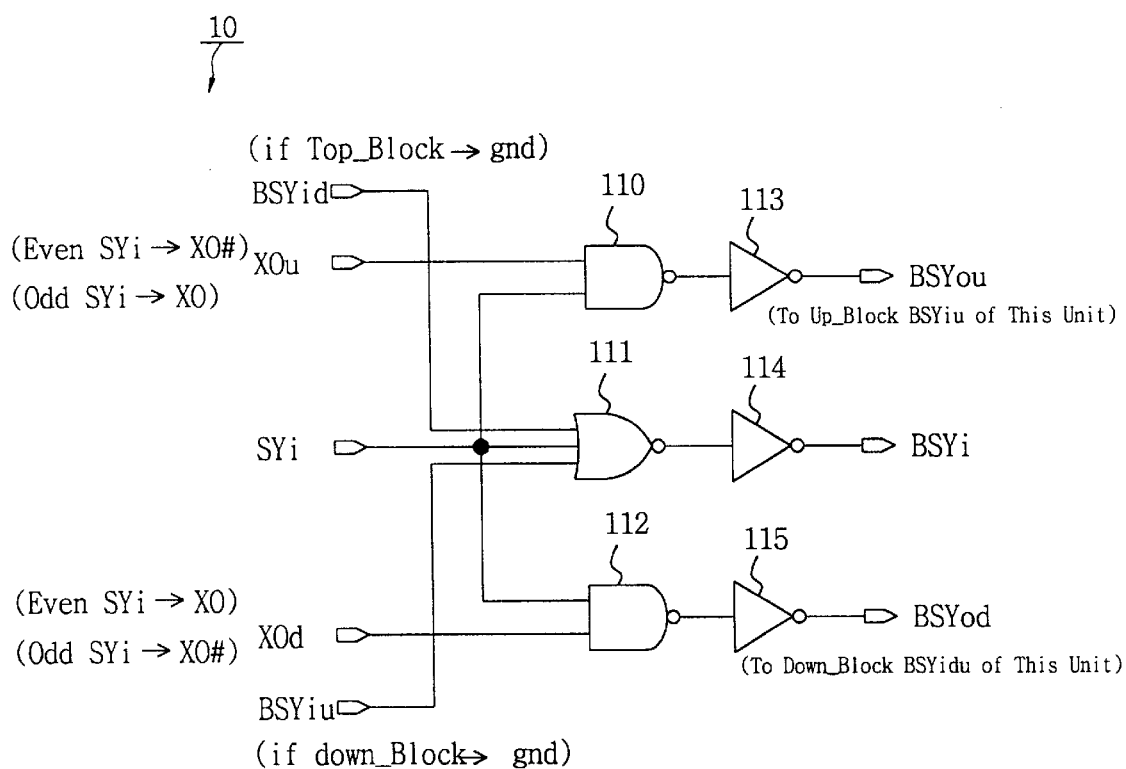
FIG. 5 is a perspective circuit diagram according to a specific embodiment of the block control unit shown in FIG. 1 in accordance with the present invention.

As shown in FIG. 5, the block control unit (BCU) 10 comprises a first NAND gate 110 for generating a NAND response by receiving one of row address decoding LSB signals X0,X0# and the column block address decoding signal SYi: SY1–SYm; a second NAND gate 112 for generating a NAND response by receiving the rest of the row address decoding LSB signals X0,X0# and the column block address decoding signal SYi; a NOR gate 111 for generating a NOR response by receiving the column block address decoding signal SYi and output signals BSYid, BSYiu of the block control unit respectively positioned at top and bottom parts thereof; a first inverter 113 for inverting an output of the first NAND gate 110 and generating a top block control signal BSYou; a second inverter 115 for inverting an output of the second NAND gate 112 and generating a bottom block control signal BSYou; and a third inverter 114 for inverting an output of the NOR gate 111 and generating a block control signal BSYi. Note that the BSYid, BSYiu are output signals BSYou, BSYod of the adjacent BCUs positioned above and below that of the drawing (see FIG. 1). The signals BSYi control the BSYD circuits 200. The signals BSYou and BSYod are respectively provided as inputs of the adjacent BCUs 10 respectively positioned above and below as shown in FIG. 1.

As shown in FIG. 1 or 5, the signal X0 out of the LSB signals X0,X0# of the row address decoding signals is activated at the same time as activation of PX1 or PX3, and the signal X0# is activated at the same time with PX0 or PX2. The signals X0,X0# determine the output level of the upper or lower control signals BSYou, BSYod of the BCU10. Likewise, the column block address decoding signal SYi and row address decoding LSB signals X0,X0# are combined to generate upper and lower control signals BSYou, BSYod and control signals BSYi, so that the control signals BSYi are activated at two or more block control units to simultaneously drive two BSYD circuits 200. For instance, if SY2 and PX0 or PX2 are activated, X0# is activated to turn the control signal BSY2 and BSYm-1 of the BCU 10 to an active state. Also, if SY2 and PX1 or PX3 are activated, X0 is activated to simultaneously turn control signals BSY2 and BSY1 to an active state. At this time, the sensing and active restoration processes are performed to non-selected column memory cell array blocks commonly sharing the selected column memory cell array blocks BY1–BYm and word lines as well as the selected column memory cell array blocks BY1–Bym. Thus, the partial word line activation method is perfectly performed in the layout structure of the DRAM like in FIG. 1.

Figure 4:
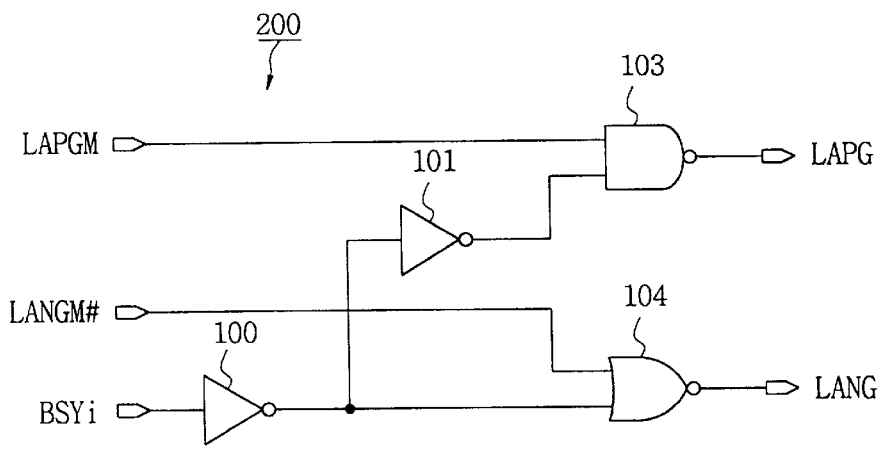
FIG. 4 is a circuit diagram according to a specific embodiment of the BSYD circuit shown in FIG. 2 or 3.

FIG. 4 illustrates the detailed structure of the BSYD circuit 200. As shown in FIG. 4, the BSYD circuit 200 comprises a first inverter 100 for inverting the block control signals BSYi; a second inverter 101 for inverting an output of the first inverter 100; a NAND gate 103 for receiving an output of the second inverter 101 and the first drive enable signal LAPGM and outputting a result of NAND gating them as a first driver activation control signal LAPG; and a NOR gate 104 for receiving an output of the first inverter 100 and the second activation enable signal LANGM# and outputting a result of NOR gating them as a second activation control signal LANG. The circuit 200 determines an output level of the control signals LANG, LAPG transmitted as an activation control signal of LA drivers by masking signals LAPGM and LANGM# with signals BSYi.

Figure 6:
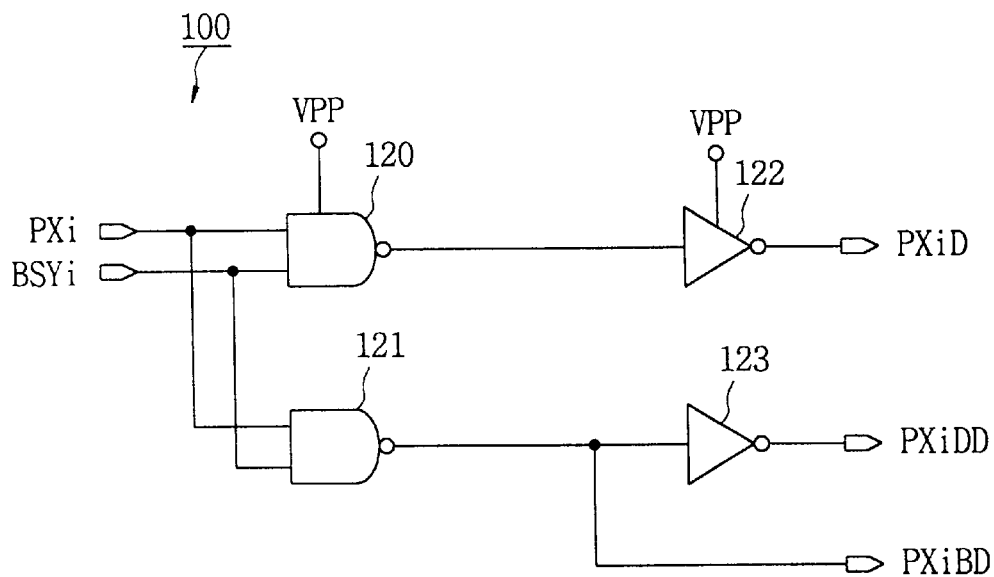
FIG. 6 is a circuit diagram according to a specific embodiment of the PXiD circuit shown in FIG. 3.

A specific structure of the PXiD circuit 100 is shown in FIG. 6. As shown in FIG. 6, the PXiD circuit 100 receives a high level of voltage VPP as operational voltage, comprising: a first NAND gate 120 for receiving address coding LSB signals PXi and the block control signals and generating a NAND response; a second NAND gate 121 for receiving address coding LSB signals PXi and the block control signals and generating a NAND response; a first inverter 122 operated by a high level of voltage VPP for inverting an output of the first NAND gate 120 and generating the first driving control signal PXiD to control the sub-word line drivers; and a second inverter 123 for inverting an output of the second NAND gate 121 and generating the second driving control signal PXiDD to control the sub-word line driver. In order to enable the word lines of the selected column memory cell array blocks, the PXiD circuit 100 receives row address LSB decoding signals PXi (PX0, PX1,PX2,PX3) and signals BSYi (BSY1–BSYm) as input signals to generate output signals PXiD, PXiDD, PXiBD.

Figure 7:
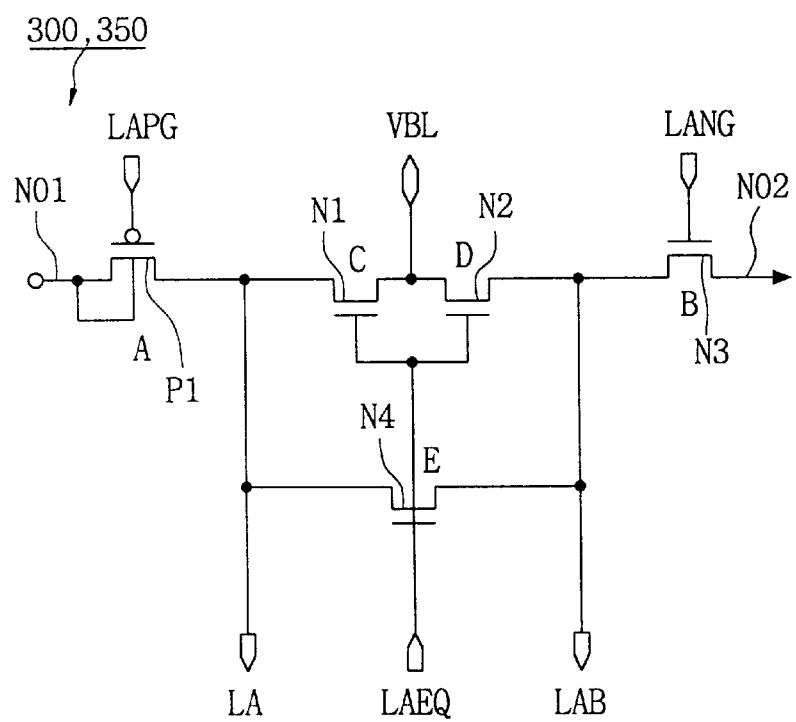
FIG. 7 illustrates circuit diagrams according to the preferred embodiments of LA drivers shown in FIG. 2 or 3.

FIG. 7 illustrates an embodiment of the detailed structure of the LA drivers 300. As shown in FIG. 7, the LA drivers 300 comprises a PMOS transistor P1 with its source being connected with a node NO1 where cell array supply voltage is supplied, its gate to receive the first driver activation control signal LAPG and its drain to output a first block sense amplifier activation signal LA; a NMOS transistor N3 with its source being connected to a node NO2 where supply voltage is provided, its gate to receive the second driver activation control signal LANG and its drain to output the second block sense amplifier activation signal LAB; the first and second NMOS transistors N1,N2 with its drain-source channel being connected between drains of the PMOS and NMOS transistors P1,N3 and all gates to commonly receive an equalize signal LAEQ; and a NMOS transistor N4 with its gate to receive the equalize signal LAEQ and its drain-source channel being connected between the drains of the PMOS and NMOS transistors P1, N3.

Figure 8:
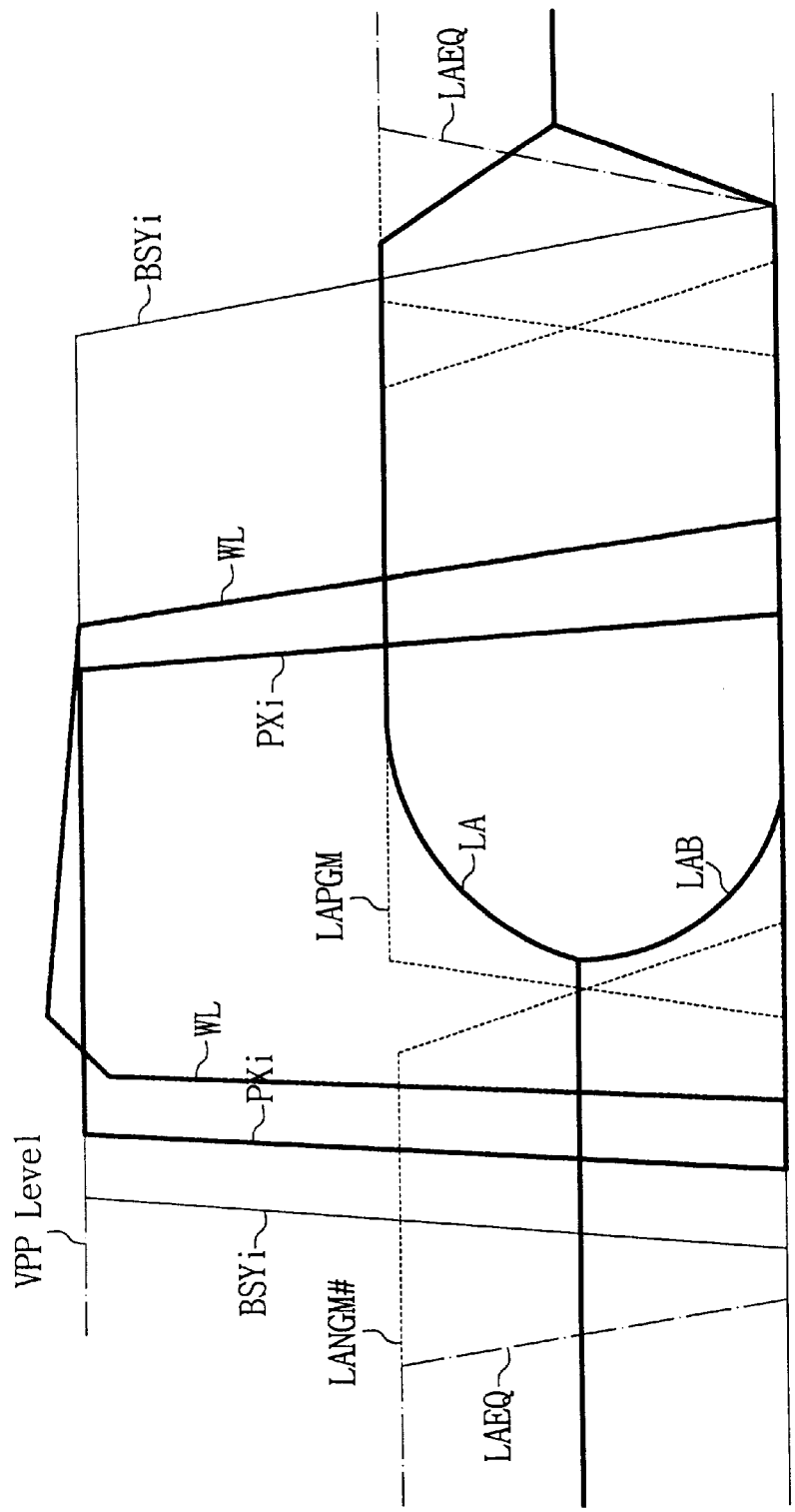
FIG. 8 is an operational timing view of a partial word line activation method in accordance with the present invention.

FIG. 8 illustrates operating timings of a partial word line activation method applied to the present invention. As shown in FIG. 8, activation of block control signals BSYi can allow address coding LSB signals PXi to enable corresponding word lines and the first block sense amplifier driving signals LA, LAB. At this time, the activation level of the signals BSYi is transmitted high, for instance, a high level of voltage VVP. This is because the inverter 122 and the NAND gate 120 in the circuit of FIG. 6 are operated by a high level of voltage, VVP, as an operational level of voltage. The activation level of the signals BSYi is set higher than the level of normal supply voltage in consideration of leakage in current.

Hereinafter, operations of the LA drivers 300 will be described with reference to FIGS. 2 and 3 according to embodiments of the present invention.

First of all, as shown in FIG. 2, the first activation method will be described. The activation method relates to a case that two LA drivers 300a, 300b are arranged in a conjunction area 50. When two block control signals BSYi are transmitted to two BSYD circuits 200, LA driver control signals LAPG, LANG generated by one BSYD circuit are used for driving one of LA drivers (for instance, an upper driver) in the related conjunction area 50 and a lower LA driver in the conjunction area positioned at the top part of the related conjunction area 50. As soon as the upper LA driver 300a in the conjunction area 50 and the lower LA driver (not shown) in the conjunction area positioned at the top part of the conjunction area 50 are simultaneously driven, the rest LA driver (in this case, a lower LA driver: 300b) in the conjunction area 50 is driven by LA driver control signals LAPG, LANG provided from the BSYD circuit in another conjunction area positioned below. As a result, two signals BSYi are activated to drive 4 LA drivers in total, thereby completely driving the two corresponding block sense amplifiers. Reference numerals 101,102,103,201,202,204 labeled in FIG. 2 respectively indicate input/output nodes of the circuit. For instance, reference numeral 101 is an input node to which signals PXi are transmitted. Likewise, if the driving capacity of LA drivers is secured, it is known that there is an improvement in the speed of sensing and active restoration of memory cells.

Now, as shown in FIG. 3, the second activation method will be described below. It relates to a case that one LA driver 350 is installed in the conjunction area 50. As shown in FIG. 3, only one LA driver is arranged in the space where two LA drivers can be accommodated. At this time, it is possible to enlarge the size of PMOS and NMOS transistors A,B of the LA driver 350 shown in FIG. 7 twice. Since the LA driver 350 having activation capacity twice bigger than that shown in FIG. 2 drives block sense amplifiers 30 of its own block, the same driving capacity as that in FIG. 2 can be guaranteed in actuality. There is an advantage in this method in that the LA driver control signals LAPG, LANG can be routed in the conjunction area 50.

In the semiconductor memory device having the structure shown in FIG. 1, the partial word line activation method is prevented in the intervals of refresh operations. In other words, static refresh operations should be performed in the intervals of refresh operations to activate word lines in sequence. In this case, all the signals SY1–Sym are transmitted at the high level thereof. Thus, all control signals of BSY1–BSYm turn to the high level thereof, so that the word lines are not partially enabled, but fully enabled. In addition, LA driver is also fully activated. At last, in the intervals of refresh operations, partial word lines are prevented from being activated.

It should be apparent that the concepts presented in the present invention can be used for specific applications in a variety of ways. Also, the detailed structure of the block control unit or operational timing signals disclosed in the preferred embodiments of the present invention illustrate a part of operational methods in accordance with the present invention, and there may be more methods to be effectively utilized by circuit designers.

As described above, there are advantages in the present invention such as to reduce power consumption, to secure driving capacity of LA drivers and to improve the speed of sensing and active restoration of memory cells on the basis of a conventional partial word line driving method. Therefore, there is an advantage of improving the performance of a semiconductor memory device.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A semiconductor memory device, comprising:
   a plurality of sub-word line drivers arranged at all memory cell array blocks in the direction of bit lines and respectively shared by two memory cell array blocks;
   a plurality of block sense amplifiers arranged at all memory cell array blocks in the direction of word lines and respectively shared by two memory cell array blocks;
   a plurality of circuit blocks respectively arranged at conjunction areas where areas accommodating sub-word line drivers and block sense amplifiers are crossed, said conjunction areas comprising:
      one or more LA drivers adapted to drive block sense amplifiers;
      one or more PXiD circuits adapted to generate driving control signals to control sub-word line drivers; and
      one or more BSYD circuits adapted to selectively enable LA drivers in response to transmitted block control signals; and
   a plurality of block control units adapted to generate upper and lower block control signals by combining block column and row address decoding signals and simultaneously activating two or more BSYD circuits with the block control signals.

2. The device of claim 1, wherein the block control unit generates upper and lower block control signals BSYou, BSYod and block control signals in combination with column block address decoding signals SY1–Sym, row address decoding LSB signals X0,X0# and output signals BSYid, BSYiu of the block control unit.

3. The device of claim 2, wherein the row address decoding LSB signal X0 is activated at the same time when odd word line driving signal PX1 or PX3 is activated, and the row address decoding LSB signal X0# is activated at the same time that even word line driving signals PX0 or PX2 is activated.

4. The device of claim 1, wherein the level of the block control signal generated by the block control unit is a high level of voltage, VVP, higher than that of the normal supply voltage.

5. The device of claim 1, wherein the LA drivers of a plurality of circuit blocks are arranged in each conjunction area.

6. The device of claim 1, wherein the LA drivers in a plurality of circuit blocks are respectively arranged by two conjunction area.

7. The device of claim 1, wherein all the block control signals BSYi respectively output from a plurality of block control units are set at the high level thereof during the refresh operations of the memory cells.

8. A semiconductor memory device, comprising:
a plurality of memory cell array blocks constructed with a plurality of refresh type memory cells;
a refresh circuit adapted to generate refresh address signals to refresh the memory cells during a refresh operation;
row and column decoders adapted to designate addresses to one or more memory cells according to address signals;
a plurality of sub-word line drivers arranged at the memory cell array blocks in the first direction and shared by two memory cell array blocks;
a plurality of block sense amplifiers arranged at the memory cell array blocks in the second direction, in perpendicular to that of the first one, and shared by two memory cell array blocks;
a plurality of circuit blocks constructed with LA drivers respectively arranged at each conjunction area, where areas accommodating sub-word line drivers and block sense amplifiers are crossed, adapted to drive the block sense amplifiers, a PXiD circuit that generates driving control signals to control sub-word line drivers to activate sub-word lines connected with the memory cells; and
a BSYD circuit adapted to selectively enable said LA drivers in response to transmitted block control signals; and
a plurality of block control units arranged correspondingly to the number of circuit blocks and adapted to respectively generate upper and lower block control signals by combining block column and row address decoding signals and simultaneously activating two or more BSYD circuits of the circuit blocks.

9. The device of claim 8, wherein the block control units further comprises:
a first NAND gate adapted to generate a NAND response by receiving one of row address decoding LSB signals X0,X0# and column block address decoding signals SYi;
a second NAND gate adapted to generate a NAND response by receiving the rest of the row address decoding LSB signals X0,X0# and column block address decoding signals SYi;
a NOR gate adapted to generate a NOR response by receiving the column block address decoding signals and output signals BSYid, BSYiu of the block control unit respectively positioned at top and bottom parts thereof;
a first inverter adapted to invert an output of the first NAND gate and generate an upper block control signal BSYou;
a second inverter adapted to invert an output of the second NAND gate and generate a lower block control signal BSYou; and
a third inverter adapted to invert an output of the NOR gate and generate a block control signal BSYi.

10. The device of claim 8, wherein the BSYD circuit comprises:
a first Inverter adapted to invert the block control signals;
a second inverter adapted to invert an output of the first inverter;
a NAND gate adapted to receive an output of the second inverter and the first drive enable signal and outputting a result of NAND gating them as a first driver activation control signal; and
a NOR gate adapted to receive an output of the first inverter and the second activation enable signal and outputting a result of NOR gating them as a second drive activation control signal.

11. The device of claim 8, wherein the PXiD circuit comprises:
a first NAND gate adapted to receive address coding LSB signals PXi and the block control signals to generate a NAND response;
a second NAND gate adapted to receive address coding LSB signals PXi and the block control signals to generate a NAND response;
a first inverter operated by a high level of voltage adapted to invert an output of the first NAND gate and generating the first driving control signal to control the sub-word line drivers; and
a second inverter adapted to invert an output of the second NAND gate and generating the second driving control signal PXiDD to control the sub-word line driver.

12. The device of claim 8, wherein the LA drivers comprise:
a PMOS transistor with its source being connected with a node where cell array supply voltage is supplied, its gate to receive the first driver activation control signal and its drain to output a first block sense amplifier activation signal;
a NMOS transistor with its source being connected to a node where supply voltage is provided, its gate to receive the second driver activation control signal and its drain to output the second block sense amplifier activation signal;
the first and second NMOS transistors with its drain-source channel being connected between drains of the PMOS and NMOS transistors and all gates to commonly receive an equalize signal; and
an equalizing NMOS transistor with its gate to receive the equalizing signal and its drain-source channel being connected between the drains of the PMOS and NMOS transistor.

13. The device of claim 8, wherein the BSYD circuit comprises:
a first inverter adapted to invert the block control signals;
a second inverter adapted to invert an output of the first inverter; a NAND gate adapted to receive an output of the second inverter and the first drive enable signal and outputting a result of NAND gating them as a first driver activation control signal; and
a NOR gate 104 adapted to receive an output of the first inverter and the second activation enable signal and outputting a result of NOR gating them as a second drive activation control signal.

14. A method of operating a semiconductor memory device, comprising:
combining column block address decoding signals and row address decoding LSB signals; and
activating with a combined signals respectively two BSYD circuits that drive LA drivers arranged in conjunction areas.

15. The method of claim 14, wherein the LA drivers are driven to drive two block sense amplifiers when two BSYD circuits are activated.

16. The method of claim 14, wherein sensing and active restoration processes are performed to non-selected column memory cell array blocks that commonly share word lines of selected column memory cell array blocks as well as the column memory cell array blocks selected when two BSYD circuits are activated.

17. A semiconductor memory device, comprising:
- a plurality of sub-word line drivers arranged at all memory cell array blocks in the direction of bit lines and respectively shared by two memory cell array blocks;
- a plurality of block sense amplifiers arranged at all memory cell array blocks in the direction of word lines and respectively shared by two memory cell array blocks;
- a plurality of circuit blocks respectively arranged at conjunction areas where areas accommodating sub-word line drivers and block sense amplifiers are crossed, said conjunction areas comprising:
  - one or more LA driver means for driving said block sense amplifiers;
  - one or more PXiD circuit means for generating driving control signals to control sub-word line drivers; and
  - one or more BSYD circuit means for selectively enabling LA drivers in response to transmitted block control signals; and
  - a plurality of block control unit means for generating upper and lower block control signals.

18. A semiconductor memory device, comprising:
- a plurality of memory cell blocks, said memory cell blocks comprising a plurality of refresh-type memory cells;
- a plurality of sub-word line drivers arranged at all memory cell array blocks in the direction of bit lines and shared by two memory cell array blocks;
- a plurality of block sense amplifiers arranged at all memory cell array blocks in the direction of word lines and shared by two memory cell array blocks out of the memory cell array blocks by row address and block column address and simultaneously activating memory cell array blocks adjacent to the specific memory cell array blocks by a part of bits of the row address.

19. A semiconductor memory device, comprising:
- a plurality of memory cell blocks, said memory cell blocks comprising a plurality of refresh-type memory cells;
- a plurality of sub-word line drivers arranged at all memory cell array blocks in the direction of bit lines and shared by two memory cell array blocks;
- a plurality of block sense amplifiers arranged at all memory cell array blocks in the direction of word lines and shared by two memory cell array blocks out of the memory cell array blocks by row address and block column address and simultaneously activating memory cell array blocks adjacent to the specific memory cell array blocks by combining several bits of the row address.

20. The device of claim 19, wherein the adjacent memory cell array blocks share the sub-word lines together with the specific memory array blocks.

* * * * *